US012588530B2

(12) United States Patent
Kikuchi et al.

(10) Patent No.: US 12,588,530 B2
(45) Date of Patent: Mar. 24, 2026

(54) QUANTUM DEVICE

(71) Applicant: NEC CORPORATION, Tokyo (JP)

(72) Inventors: Katsumi Kikuchi, Tokyo (JP); Akira Miyata, Tokyo (JP); Suguru Watanabe, Tokyo (JP); Takanori Nishi, Tokyo (JP); Hideyuki Satou, Tokyo (JP); Kenji Nanba, Tokyo (JP); Ayami Yamaguchi, Tokyo (JP)

(73) Assignee: NEC CORPORATION, Tokyo (JP)

( * ) Notice: Subject to any disclaimer, the term of this patent is extended or adjusted under 35 U.S.C. 154(b) by 201 days.

(21) Appl. No.: 18/226,866

(22) Filed: Jul. 27, 2023

(65) Prior Publication Data

US 2024/0136274 A1 Apr. 25, 2024
US 2024/0234293 A9 Jul. 11, 2024

Related U.S. Application Data

(63) Continuation of application No. 17/342,811, filed on Jun. 9, 2021, now abandoned.

(30) Foreign Application Priority Data

Jun. 19, 2020 (JP) ................................. 2020-106149

(51) Int. Cl.
H01L 23/498 (2006.01)
G06N 10/40 (2022.01)
(Continued)

(52) U.S. Cl.
CPC ....... H01L 23/49888 (2013.01); G06N 10/40 (2022.01); H01L 23/13 (2013.01);
(Continued)

(58) Field of Classification Search
CPC ...... H10N 60/81; H10N 60/815; H10N 60/82; H01L 23/49888
See application file for complete search history.

(56) References Cited

U.S. PATENT DOCUMENTS

2016/0260695 A1* 9/2016 Chung .................... H01L 24/14
2017/0373044 A1 12/2017 Das
(Continued)

FOREIGN PATENT DOCUMENTS

JP H09-252026 A 9/1997
JP 2019-537239 A 12/2019
WO 2018/212041 A1 11/2018

OTHER PUBLICATIONS

JP Office Action for Japanese Patent Application No. 2020-106149, mailed on Mar. 5, 2024 with English Translation.

*Primary Examiner* — Aaron J Gray
(74) *Attorney, Agent, or Firm* — Sughrue Mion, PLLC

(57) ABSTRACT

A quantum device capable of effectively cooling a quantum chip and an area (e.g., a space) therearound is provided. A quantum device includes a quantum chip and an interposer on which the quantum chip is located. The interposer includes an interposer substrate and an interposer wiring layer. The interposer wiring layer is disposed on a surface of the interposer substrate on a side on which the quantum chip is located. The interposer wiring layer includes, in at least a part thereof, a superconducting material layer formed of a superconducting material and a non-superconducting material layer formed of a non-superconducting material.

6 Claims, 11 Drawing Sheets

(51) Int. Cl.

| | |
|---|---|
| *H01L 23/13* | (2006.01) |
| *H01L 23/36* | (2006.01) |
| *H01L 23/367* | (2006.01) |
| *H10N 60/81* | (2023.01) |
| *H10N 69/00* | (2023.01) |

(52) U.S. Cl.
CPC ....... *H01L 23/3677* (2013.01); *H10N 60/815* (2023.02); *H10N 69/00* (2023.02); *H01L 23/36* (2013.01)

(56) References Cited

U.S. PATENT DOCUMENTS

| | | | |
|---|---|---|---|
| 2018/0102470 A1* | 4/2018 | Das ........................ | H10N 60/85 |
| 2019/0044047 A1* | 2/2019 | Elsherbini ......... | H01L 23/49888 |
| 2019/0058005 A1 | 2/2019 | Pesetski et al. | |

* cited by examiner

24

27

28

22

30

QUANTUM DEVICE

INCORPORATION BY REFERENCE

This is a Continuation of U.S. application Ser. No. 17/342,811, filed on Jun. 9, 2021, which claims the benefit of priority from Japanese patent application No. 2020-106149, filed on Jun. 19, 2020, the disclosures of which are incorporated herein in their entirety by reference.

TECHNICAL FIELD

The present disclosure relates to a quantum device.

BACKGROUND ART

International Patent Application No. WO2018/212041 discloses a structure in which a first quantum-bit substrate and a second quantum-bit substrate are connected to each other on a base substrate including superconducting wiring lines extending in parallel to each other by using a flip-chip connecting technique. Further, Published Japanese Translation of PCT International Publication for Patent Application, No. 2019-537239 discloses a quantum computing assembly (a quantum computing device) in which a quantum-device die for generating a plurality of qubits and a control-circuit die for controlling the operation of the quantum-device die are disposed on a substrate. The quantum computing device may include a cooling unit.

A quantum device (a quantum computer) using a quantum chip operates while being cooled to an extremely low temperature of about 10 mK (milli-Kelvin; absolute temperature). Further, in order to obtain a thermal insulating property, an area (e.g., a space) around the quantum device is often kept in a vacuum state. However, in general, the vacuum space does not function as a heat conduction path. Note that, in the above-mentioned patent documents, a wiring layer is formed of a superconducting material. Further, the superconducting material hardly transmits any heat in a superconducting state. Therefore, in the above-mentioned patent documents, there is a possibility that the quantum chip (e.g., the quantum-bit substrate and the quantum-device die) and the area (e.g., the space) therearound may not be effectively cooled.

The present disclosure has been made to solve above-described problem, and an object thereof is to provide a quantum device capable of effectively cooling a quantum chip and an area (e.g., a space) therearound.

SUMMARY

In a first example aspect, a quantum device includes: a quantum chip in which a quantum bit is formed; and an interposer on which the quantum chip is mounted, in which the interposer includes: a substrate; and a wiring layer disposed on a surface of the substrate on a side thereof on which the quantum chip is located, and the wiring layer includes, in at least a part thereof, a first metal layer formed of a superconducting material and a second metal layer formed of a non-superconducting (i.e., normal conducting) material.

According to the present disclosure, it is possible to provide a quantum device capable of effectively cooling a quantum chip and an area (e.g., a space) therearound.

BRIEF DESCRIPTION OF DRAWINGS

The above and other aspects, features and advantages of the present disclosure will become more apparent from the following description of certain example embodiments when taken in conjunction with the accompanying drawings, in which.

EXAMPLE EMBODIMENTS

Overview of Example Embodiment According to Present Disclosure

Quantum computing is a technical field in which data is manipulated by using a quantum mechanical phenomenon (a quantum bit). Further, the quantum mechanical phenomenon is, for example, superposition of a plurality of states (i.e., a quantum variable simultaneously assumes a plurality of different states) or entanglement (i.e., a state in which a plurality of quantum variables are related to each other regardless of space or time). In a quantum chip (which will be described later), a quantum circuit that generates a quantum bit is provided.

Figure 1:
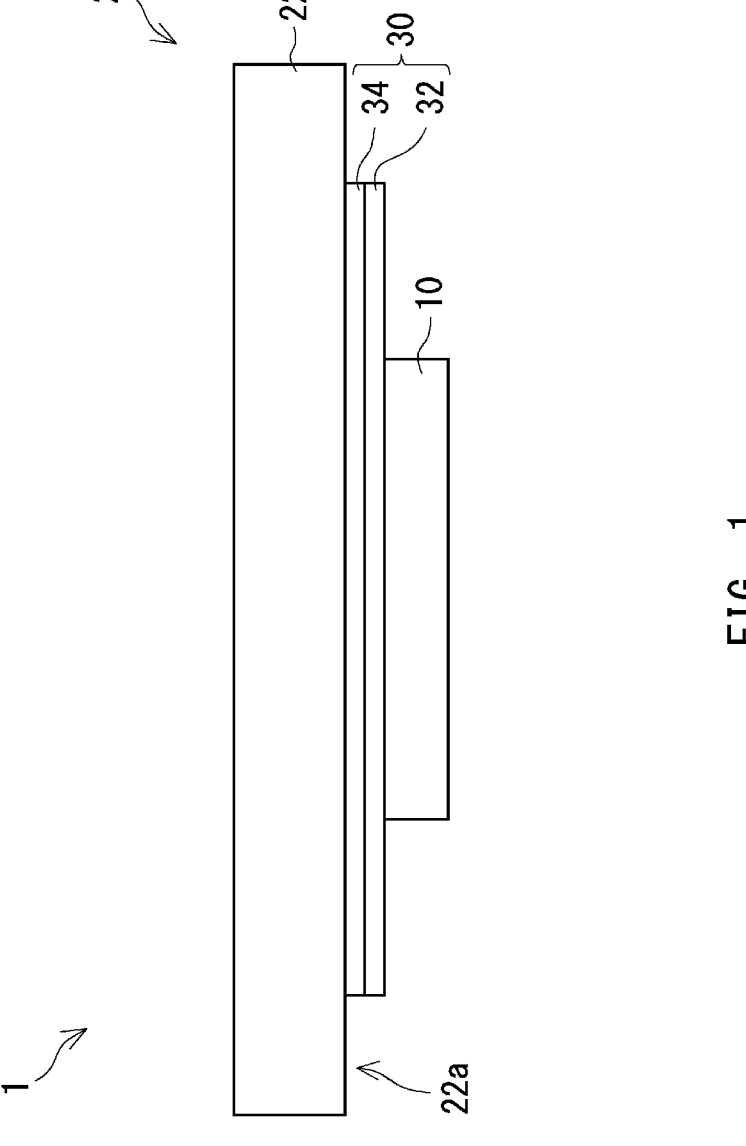
FIG. 1 shows an overview of a quantum device according to this example embodiment.

Prior to a description of an example embodiment according to the present disclosure, an overview of the example embodiment according to the present disclosure will be described hereinafter. FIG. 1 shows an overview of a quantum device 1 according to this example embodiment. FIG. 1 is a side view (a cross-sectional view) of the quantum device 1 according to this example embodiment.

As shown in FIG. 1, the quantum device 1 includes a quantum chip 10 and an interposer 20 on which the quantum chip 10 is located. The quantum chip 10 includes a quantum circuit (not shown) such as a resonator (a loop circuit and a conductive member connected to the loop circuit). The quantum circuit performs processing by using the resonator in a superconducting state in which the quantum chip is in a quantum state. As described above, the quantum chip 10 includes the quantum circuit and performs processing under the quantum state (i.e., by using the quantum mechanical phenomenon). That is, a quantum computer can be constructed by using such a quantum device 1 (a quantum chip 10).

The interposer 20 has an interposer substrate 22 (a substrate) and an interposer wiring layer 30 (a wiring layer). The interposer wiring layer 30 is disposed on a surface 22a of the interposer substrate 22 on the side thereof on which the quantum chip 10 is located. Note that, in FIG. 1, the quantum chip 10 is depicted as if it is in direct contact with the interposer wiring layer 30. However, as will be described later, for example, the quantum chip 10 may be mounted on the interposer 20 (on the interposer wiring layer 30) with bumps or the like interposed therebetween. The bumps may be formed of, for example, a superconducting material as described later.

The interposer wiring layer 30 includes a plurality of metal layers. Specifically, the interposer wiring layer 30 includes a superconducting material layer 32 (a first metal layer) formed of a superconducting material and a non-superconducting material layer 34 (a second metal layer) formed of a non-superconducting (i.e., normal conducting) material. Note that the superconducting material is a material that becomes superconductive at an extremely low temperature (about 10 mK) as described later. Further, the non-superconducting material is a material that does not become superconductive in any temperature range as described later.

Note that the interposer wiring layer 30 as a whole is composed of the superconducting material layer 32 and the non-superconducting material layer 34 in FIG. 1, the structure of the interposer wiring layer 30 is not limited to this example structure. The interposer wiring layer 30 may be configured to have, in at least a part of the interposer wiring layer 30, the superconducting material layer 32 and the non-superconducting material layer 34. For example, in at least a predetermined part (a first area) of the interposer wiring layer 30, the interposer wiring layer 30 may be configured to have the superconducting material layer 32 and the non-superconducting material layer 34. Further, although the superconducting material layer 32 is depicted in such a manner that the superconducting material layer 32 is closer to the quantum chip 10 than the non-superconducting material layer 34 is in FIG. 1, the positional relation between the superconducting material layer 32 and the non-superconducting material layer 34 is not limited to this example arrangement.

Note that although a silicon substrate is used as the interposer substrate 22 and like in this example embodiment, the material of the substrate is not limited to silicon. For example, a sapphire substrate, a compound semiconductor substrate (Groups IV, III-V, and II-VI), or a glass substrate may be used as the interposer substrate 22 and the like. These materials are preferably single-crystalline materials, but they may be polycrystalline materials or amorphous materials. Further, the surface of the interposer substrate 22 is preferably covered by a silicon oxide film (such as a $SiO_2$ film or a TEOS film). Further, in this example embodiment, the superconducting material is, for example, niobium (Nb), niobium nitride, aluminum (Al), indium (In), lead (Pb), tin (Sn), rhenium (Re), palladium (Pd), titanium (Ti), titanium nitride, tantalum (Ta), or an alloy containing at least one of them. Further, in this example embodiment, the non-superconducting material is, for example, copper (Cu), silver (Ag), gold (Au), platinum (Pt), or an alloy containing at least one of them. Note that, in order to obtain a superconducting state, the quantum device 1 is used in an environment having a temperature of, for example, about 10 mK (milli-Kelvin) that is obtained by using a refrigerator (or a freezer).

Figure 2:
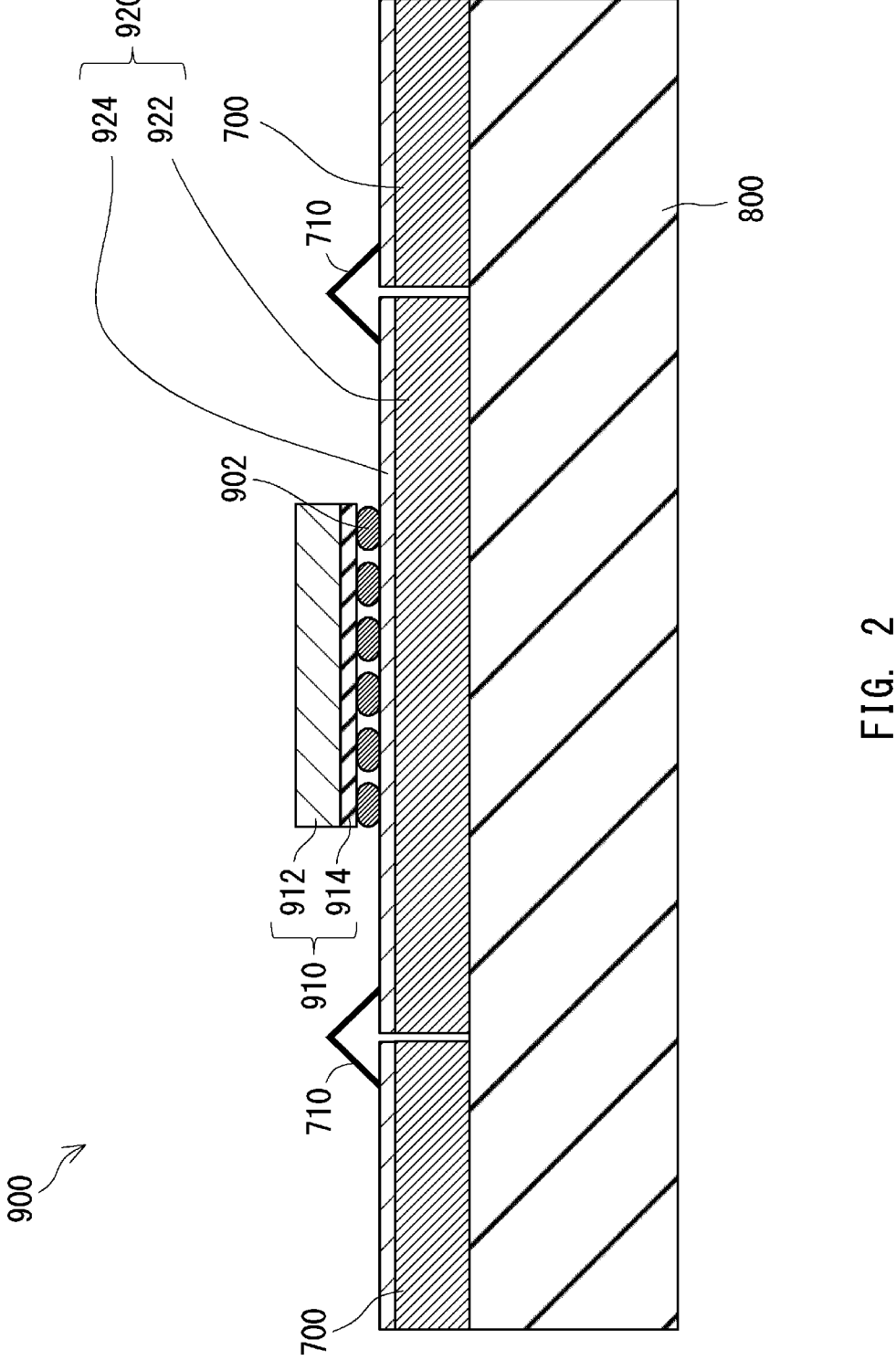
FIG. 2 shows a configuration of a quantum device according to a comparative example.

Advantageous effects of the quantum device 1 according to this example embodiment will be described hereinafter by using a comparative example. FIG. 2 shows a configuration of a quantum device 900 according to a comparative example. FIG. 2 is a cross-sectional view showing the quantum device 900 according to the comparative example. The quantum device 900 includes a quantum chip 910 and an interposer 920. The configuration of the quantum chip 910 may be substantially similar to that of the above-described quantum chip 10. The quantum chip 910 is mounted on the interposer 920. Specifically, the quantum chip 910 is connected to the interposer 920 by using a flip-chip connecting technique (hereinafter also expressed as being flip-chip connected). That is, the quantum chip 910 is connected to the interposer 920 with bumps 902 interposed therebetween.

The quantum chip 910 includes a quantum-chip substrate 912 and a superconducting wiring layer 914. The superconducting wiring layer 914 is disposed on the quantum-chip substrate 912 on the side thereof on which the interposer 920 is located. The superconducting wiring layer 914 is formed of a superconducting material like the one described above. Further, the interposer 920 includes an interposer substrate 922 and a superconducting wiring layer 924. The superconducting wiring layer 924 is disposed on a surface of the interposer substrate 922 on the side thereof on which the quantum chip 910 is located. The superconducting wiring layer 924 is connected to the superconducting wiring layer 914 with the bumps 902 interposed therebetween. Further, the superconducting wiring layer 924 is connected to an external substrate 700 through terminals 710.

Further, the quantum device 900 is mounted on a sample stage 800 having a cooling function. In the comparative example, the surface of the interposer 920 opposite to the surface thereof on which the quantum chip 910 is mounted is in contact with the sample stage 800. The quantum device 900 can be cooled to an extremely low temperature by the sample stage 800.

As described above, the area (e.g., the space) around the quantum device 900 is kept in a vacuum state to obtain a superconducting state. Therefore, the heat of the quantum chip 910 is discharged (i.e., removed) to the sample stage 800 only through the interposer 920 and the bumps 902. Note that the superconducting wiring layer 924 is disposed on the surface of the interposer 920 on the side thereof on which the quantum chip 910 is located. Further, as described above, in the superconductive state at an extremely low temperature (e.g., 10 mK), the superconducting material is substantially in a heat insulating state in which heat is hardly transferred. Therefore, the superconducting wiring layer 924 hardly transmits any heat in the superconducting state. Accordingly, there is a possibility that even when the quantum chip 910 and its vicinity are cooled through the interposer 920 by using the sample stage 800, they are not efficiently cooled.

In contrast to this, the interposer wiring layer 30 includes the superconducting material layer 32 and the non-superconducting material layer 34 in the quantum device 1 according to this example embodiment. Further, the non-superconducting material transfers heat even at an extremely low temperature. That is, the thermal conductivity of the non-superconducting material is much higher than that of the superconducting material at an extremely low temperature. Therefore, the non-superconducting material layer 34 contributes to the dissipation of heat from the quantum chip 10 and the vicinity thereof. In this way, it is possible, when the quantum chip 10 and the area (e.g., the space) thereof are cooled through the interposer 20 by using the sample stage having the cooling function, to improve the heat conduction between the sample stage and the quantum chip 10 as compared to the comparative example. Therefore, the quantum device 1 according to this example embodiment can effectively cool the quantum chip and the area (e.g., the space) therearound.

First Example Embodiment

An example embodiment will be described hereinafter with reference to the drawings. The following description and the drawings are partially omitted and simplified as appropriate for clarifying the explanation. Further, the same elements are denoted by the same reference numerals (or symbols) throughout the drawings, and redundant descriptions thereof are omitted as appropriate.

Figure 3:
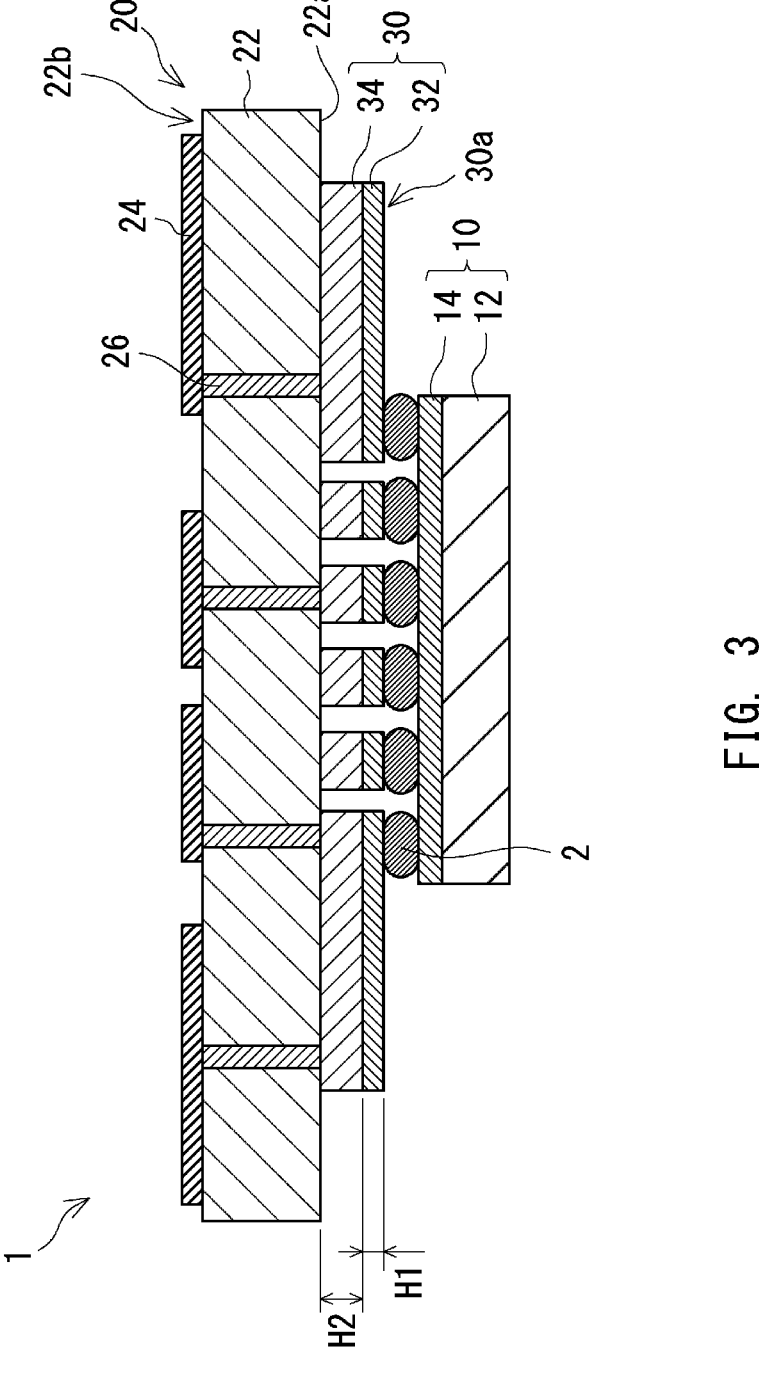
FIG. 3 shows a quantum device according to a first example embodiment.

FIG. 3 shows a quantum device 1 according to a first example embodiment. FIG. 3 is a cross-sectional view showing the quantum device 1 according to the first example embodiment. As described above, the quantum device 1 includes a quantum chip 10 and an interposer 20. The quantum chip 10 is flip-chip connected to the interposer 20. That is, the quantum chip 10 is connected to the interposer 20 with bumps 2 interposed therebetween.

The quantum chip 10 includes a quantum-chip substrate 12 and a superconducting wiring layer 14. The quantum-chip substrate 12 is formed of, for example, a silicon substrate like the one described above. The superconducting wiring layer 14 is formed of a superconducting material such as niobium (Nb) as described above. The superconducting wiring layer 14 is disposed on the quantum-chip substrate 12 on the side thereof on which the interposer 20 is located. The above-described quantum circuit is formed in the superconducting wiring layer 14. Further, a circuit for a ground electrode (hereinafter also referred to as a ground electrode circuit) may be formed in the superconducting wiring layer 14. Further, in the above-described quantum circuit, aluminum (Al) is preferably used as the material used for the Josephson junction, but other superconducting materials may be used as the material used for the Josephson junction.

The interposer 20 includes an interposer substrate 22, an interposer wiring layer 30, an interposer wiring layer 24, and through vias 26 (in this specification, the term "through via" also means a conductive material with which the through via is filled). The interposer wiring layer 24 is disposed on a surface 22b of the interposer substrate 22 opposite to the surface thereof on which the quantum chip 10 is located. The interposer wiring layer 24 may contain the above-described superconducting material. In such a case, the interposer wiring layer 24 may contain the same superconducting material as that contained in the superconducting wiring layer 14 or the interposer wiring layer 30 (the superconducting material layer 32), and/or a superconducting material different from that contained in the superconducting wiring layer 14 or the interposer wiring layer 30. Further, the interposer wiring layer 24 may contain a non-superconducting material. In such a case, the interposer wiring layer 24 may contain the same non-superconducting material as that contained in the interposer wiring layer 30 (the non-superconducting material layer 34), and/or a non-superconducting material different from that contained in the interposer wiring layer 30. For example, the surface of the interposer wiring layer 24 preferably contains copper (Cu), and titanium (Ti) under the copper (Cu). For example, in the case where the interposer substrate 22 contains silicon, the surface 22b on the opposite side of the interposer 20 preferably has a structure expressed as $Cu/Ti/SiO_2/Si$ (the interposer substrate 22).

Further, although the interposer 20 shown in FIG. 3 has a two-layer structure including wiring layers on both sides of the interposer substrate 22, the interposer 20 may have a multi-layer wiring structure having a three or more wiring layers. In such a case, for example, a substrate in which through vias are formed may be provided on the side of the interposer wiring layer 24 opposite to the side on which the interposer substrate 22 is located; a wiring layer may be provided on the side of the substrate opposite to the side on which the interposer wiring layer 24 is located; an insulating layer and another wiring layer may be provided in such a manner that the insulating layer is interposed between the wiring layers; and a multi-layer wiring structure may be formed by using vias that connect the wiring layers to each other across the insulating layer.

The through vias 26 are provided in the interposer substrate 22. When the through vias 26 is formed as through vias in a silicon substrate in the interposer 20, the through vias 26 are called TSVs (Through Silicon Vias), and they may be formed by forming conductor pieces that penetrate the substrate. The through vias 26 are formed so as to penetrate (i.e., extend through) the interposer substrate 22. Further, the interposer wiring layers 24 and 30 are electrically connected to each other by the through vias 26. Note that the through vias 26 may contain the above-described superconducting material. In such a case, the through vias 26 may contain the same superconducting material as that contained in the superconducting wiring layer 14 and the like, and/or a superconducting material different from that contained in the superconducting wiring layer 14 and the like. Alternatively, the through vias 26 may contain the above-described non-superconducting material. In such a case, the through vias 26 may contain the same non-superconducting material as that contained in the interposer wiring layer 24 or the like, and/or a non-superconducting material different from that contained in the interposer wiring layer 24 and the like. For example, each of the through vias 26 may be formed by forming $SiO_2$ (e.g., a thermal oxide film) on the side wall of a through hole having a diameter of 50 μm and filling the through hole with copper (Cu) while using titanium (Ti) as an adhesion layer.

A quantum circuit may be formed in the interposer wiring layer 30. For example, a magnetic-field applying circuit (not shown) that applies a magnetic field to a resonator (a loop circuit) may be formed in the interposer wiring layer 30. Further, a reading circuit (not shown) that reads information about a quantum state from the resonator (a conductive member) may be formed in the interposer wiring layer 30. Further, a ground electrode circuit may be formed in the interposer wiring layer 30. That is, a ground electrode circuit may be formed as a quantum circuit in the interposer wiring layer 30. In the case where a quantum circuit is formed in the interposer wiring layer 30 as described above, the interposer 20 functions as a quantum interposer.

The interposer wiring layer 30 includes a plurality of metal layers. Specifically, the interposer wiring layer 30 includes the superconducting material layer 32 and the non-superconducting material layer 34 as described above. The superconducting material layer 32 may contain the same superconducting material as that contained in the superconducting wiring layer 14, and/or a superconducting material different from that contained in the superconducting wiring layer 14. The non-superconducting material layer 34 may contain the same non-superconducting material as that contained in the interposer wiring layer 24, and/or a non-superconducting material different from that contained in the interposer wiring layer 24.

Further, when a circuit is formed in the interposer wiring layer 30, the circuit is formed by the superconducting material layer 32 and the non-superconducting material layer 34 that are stacked on each other. That is, the shape of the circuit in the superconducting material layer 32 and that in the non-superconducting material layer 34 could be identical to each other. In other words, the circuit formed in the superconducting material layer 32 and that formed in the non-superconducting material layer 34, whose shape is identical to that of the superconducting material layer 32 overlap each other (i.e., are placed on top of each other).

Further, in the first example embodiment, the superconducting material layer 32 is disposed closer to the quantum chip 10 than the non-superconducting material layer 34 is. That is, in the interposer wiring layer 30, the superconducting material layer 32 is a metal layer closest to the quantum chip 10. In other words, among a plurality of metal layers constituting the interposer wiring layer 30, the metal layer closest to the quantum chip 10 is the superconducting material layer 32. For example, in the interposer wiring layer 30, a superconducting material layer 32 made of Nb (having a thickness of 0.1 [μm]) is preferably formed, and a non-superconducting material layer 34 made of Cu (having a thickness of 2 [μm]) is preferably formed under the Nb layer. Further, a layer made of Ti is preferably formed under the Cu layer. For example, in the case where the interposer substrate 22 contains silicon, the surface 22a of the interposer 20 on the side thereof on which the quantum chip 10 is located is preferably has a structure expressed as $Nb/Cu/Ti/SiO_2/Si$ (the interposer substrate 22).

In the interposer 20, electric signals flows on the surface of the wiring layer (i.e., on the surface 30a of the interposer wiring layer 30 on the side thereof on which the quantum chip 10 is located). Further, in the quantum device 1, a phenomenon that the resistance value (the electrical resistance) of the superconducting material becomes substantially zero in the superconducting state is used. Therefore, it is possible to effectively use the low-resistance state (the superconducting state) by disposing the superconducting material layer 32 on the surface 30a that is opposed to the quantum chip 10. Further, in order to maintain the quantum state (the state in which the quantum circuit of the quantum chip 10 functions as a quantum bit) for a long time, it is necessary to adjust an environment that affects an electromagnetic field in the vicinity of the quantum circuit. Note that the quantum circuit of the quantum chip 10 is formed of the superconducting material. Therefore, it is possible to conform the environment that affects the electromagnetic field to that of the quantum chip 10 by forming the surface 30a of the interposer wiring layer 30 on the side thereof on which the quantum chip 10 is located by using the superconducting material.

Further, the superconducting wiring layer 14 is connected (e.g., flip-chip connected) to the interposer wiring layer 30 with the bumps 2 interposed therebetween. More specifically, the superconducting wiring layer 14 is connected to the superconducting material layer 32 of the interposer wiring layer 30 with the bumps 2 interposed therebetween. Note that the bumps 2 may let signals pass therethrough between the superconducting wiring layer 14 and the superconducting material layer 32. For example, the bumps 2 may connect the part of the superconducting wiring layer 14 in which the ground electrode circuit is formed to the part of the interposer wiring layer 30 (i.e., the superconducting material layer 32) in which the ground electrode circuit is formed. In this way, the potentials in these ground electrodes can be equal to each other. Alternatively, heat may be transferred through the bumps 2. In such a case, the bumps 2 may include a superconducting material and a non-superconducting material. That is, each of the bumps 2 may have a multilayer structure. Further, the flip-chip connection is preferably a layered structure expressed as Nb (the wiring lines of the quantum chip 10)/In/Ti/Nb (the wiring surface of the interposer 20)/Cu, or Nb (the wiring lines of the quantum chip 10)/Nb (the wiring surface of the interposer 20)/Cu. Copper (Cu) is preferably added to an interposer wiring layer 30 having a thickness of 2 [μm] in a range of thickness from 2 [μm] to 10 [μm], and bumps 2 each of which has a diameter of 100 [μm] are preferably provided.

Further, the thickness H1 of the superconducting material layer 32 is smaller than the thickness H2 of the non-superconducting material layer 34. That is, the thickness H2 of the non-superconducting material layer 34 is larger than the thickness H1 of the superconducting material layer 32 in the interposer wiring layer 30. Since the interposer wiring layer 30 is formed in such a manner that the thickness H2 of the non-superconducting material layer 34, which tends to transfer heat therethrough, is thicker than the thickness H1 of the superconducting material layer 32, which does not tend to transfer heat therethrough, as described above, it is possible to effectively perform the cooling.

Further, as will be described hereinafter, when the superconducting material layer 32 and the non-superconducting material layer 34 are stacked on each other, the thickness of the non-superconducting material layer 34 is preferably made thicker than that of the superconducting material layer 32 in view of the strength thereof. In order to improve the coherence (i.e., the ability to maintain the quantum state) of the quantum bit, metals in the Groups IV, V, or VI such as niobium, niobium nitride, tantalum, or titanium nitride are used in the quantum circuit. When a film is formed by using these materials, a sputtering method is often used. Note that when a film is formed by the sputtering method, crystals grow in the film-thickness direction, and in the case of the metals in the Groups IV to VI, strains in the contracting direction are accumulated during the film formation. Therefore, there is a risk that as the film thickness increases, a fracture such as cracking may occur. Therefore, the thickness of the superconducting material layer 32 should be smaller than 500 nm and preferably is, for example, about 100 nm.

Further, since the quantum device 1 (the quantum computer) is used at an extremely low temperature, the materials of components constituting the quantum device 1 may contract due to the cooling. It should be noted that the coefficient of thermal expansion (hereinafter also referred to as the thermal expansion coefficient) of a non-superconducting material is different from that of a superconducting material. Therefore, it is desirable that the superconducting material, which is easily fractured such as easily cracked, follow (i.e., conform to) the change of the non-superconducting material. Therefore, it is necessary to make the film thickness of the superconducting material smaller than that of the non-superconducting material.

Because of the above-described characteristics, the thickness of the superconducting material layer 32 is preferably smaller than that of the non-superconducting material layer 34. For example, when the superconducting material layer 32 is formed of niobium (Nb) and the non-superconducting material layer 34 is formed of copper (Cu), the thickness of the superconducting material layer 32 is preferably 0.1 μm and the thickness of the non-superconducting material layer 34 is preferably 2 μm.

Second Example Embodiment

Next, a second example embodiment will be described. The following description and the drawings are partially omitted and simplified as appropriate for clarifying the explanation. Further, the same elements are denoted by the same reference numerals (or symbols) throughout the drawings, and redundant descriptions thereof are omitted as appropriate. In the second example embodiment, the structure of the interposer wiring layer 30 is different from that in the first example embodiment. Note that, in second example embodiment, the structure other than that of the interposer wiring layer 30 is substantially similar to that in the first example embodiment, and therefore descriptions thereof are omitted as appropriate.

Figure 4:
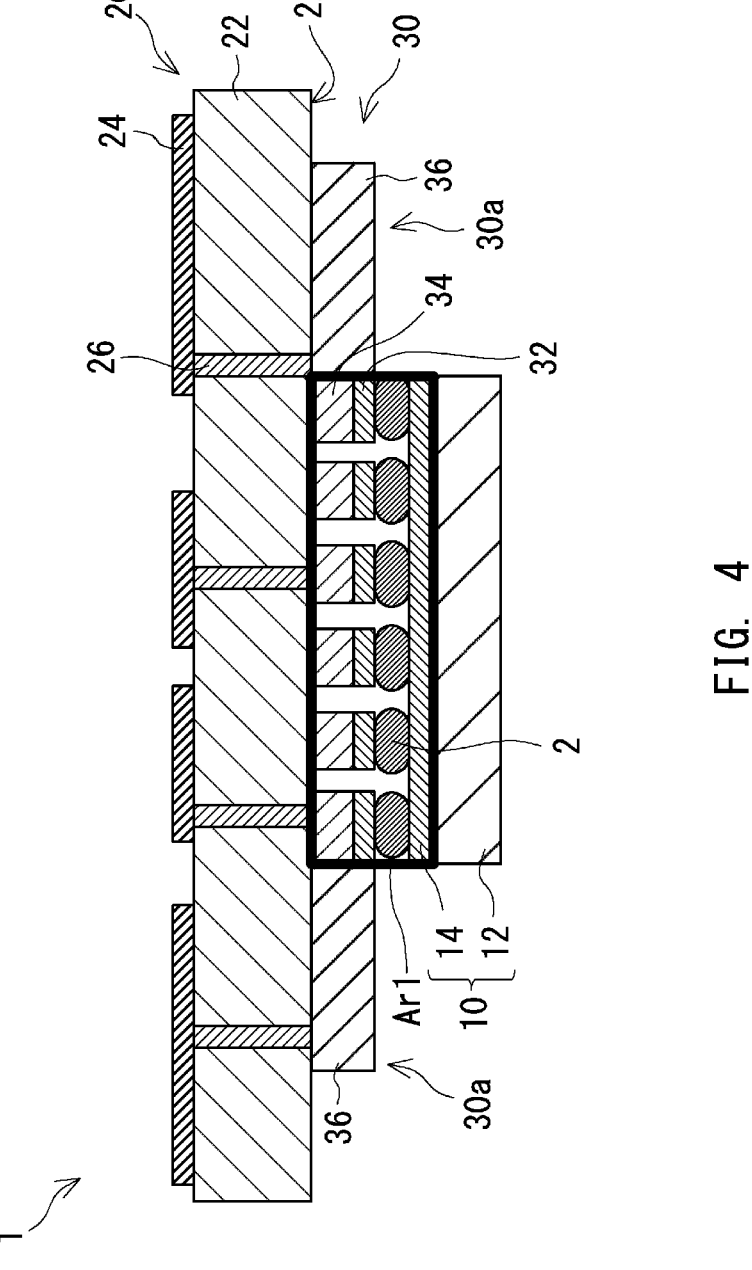
FIG. 4 shows a quantum device according to a second example embodiment.

FIG. 4 shows a quantum device 1 according to a second example embodiment. FIG. 4 is a cross-sectional view showing the quantum device 1 according to the second example embodiment. Similarly to the first example embodiment, the quantum device 1 includes a quantum chip 10 and an interposer 20. The quantum chip 10 is flip-chip connected to the interposer 20 with bumps 2 interposed therebetween. Further, similarly to the first example embodiment, an interposer wiring layer 30 is provided on a surface 20a of the interposer 20 on the side thereof on which the quantum chip 10 is located.

Note that the area between the quantum-chip substrate 12 and the interposer substrate 22 is referred to as a predetermined quantum chip area Ar1 (which is indicated by bold solid lines in FIG. 4). That is, the quantum chip area Ar1 (a first area) corresponds to the area in the interposer wiring layer 30 that is opposed to the quantum chip 10. Note that, as described above, in order to enable the quantum circuit to satisfactorily maintain the quantum state, the circuit of the quantum chip 10 and the circuit of the interposer wiring layer 30 located in the vicinity thereof are preferably formed of a superconducting material. Therefore, in the quantum chip area Ar1, the metal layer close to the quantum chip 10 is preferably formed of a superconducting material. Therefore, in the quantum chip area Ar1 (the first area), the interposer wiring layer 30 is composed of the superconducting material layer 32 and the non-superconducting material layer 34. In other words, at least a part of the interposer wiring layer 30 corresponding to the quantum chip area Ar1 includes the superconducting material layer 32 and the non-superconducting material layer 34. Further, the superconducting material layer 32 is disposed closer to the quantum chip 10 than the non-superconducting material layer 34 is.

Meanwhile, the circuit(s) in the area(s) outside the quantum chip area Ar1 does not necessarily have to be formed of a superconducting material in order to enable the quantum circuit to maintain the quantum state. Therefore, in the second example embodiment, in the area outside the quantum chip area Ar1, the interposer wiring layer 30 is formed of a non-superconducting material. That is, the interposer wiring layer 30 includes a non-superconducting material layer 36 in the area outside the quantum chip area Ar1. Further, in the area outside the quantum chip area Ar1, the interposer wiring layer 30 has a single-layer structure composed of the non-superconducting material layer 36 alone. Note that the non-superconducting material layer 36 may be formed integrally with the non-superconducting material layer 34. Further, the non-superconducting material layer 36 may be formed of the same material as that of the non-superconducting material layer 34, or may be formed of a material different from that of the non-superconducting material layer 34.

Note that, in the area outside the quantum chip area Ar1, the interposer wiring layer 30 may include the superconducting material layer 32 and the non-superconducting material layer 34. In such a case, the superconducting material layer 32 does not have to be disposed closer to the quantum chip 10 than the non-superconducting material layer 34 is. That is, the non-superconducting material layer 34 may be disposed closer to the quantum chip 10 than the superconducting material layer 32 is. Therefore, in the second example embodiment, in at least a part of the area outside the quantum chip area Ar1 of the interposer wiring layer 30, the surface 30a of the interposer wiring layer 30 on the side thereof on which the quantum chip 10 is located is formed of a non-superconducting material.

Since the interposer wiring layer 30 has the above-described structure, it is possible to cool the quantum chip 10 and the vicinity thereof (e.g., the quantum chip area Ar1) more effectively when they are cooled. For example, when the quantum device 1 is cooled as described in the below-shown example embodiment, it is possible improve the cooling effect even further by keeping the non-superconducting material layers 34 and 36 in contact with the sample stage and cool. Note that, in FIG. 4, the non-superconducting material layer 36 is provided over the entire area outside the quantum chip area Ar1 of the interposer wiring layer 30. However, as shown in an example described later, the non-superconducting material layer 36 may be provided only in a part of the area outside the quantum chip area Ar1.

Third Example Embodiment

Next, a third example embodiment will be described. The following description and the drawings are partially omitted and simplified as appropriate for clarifying the explanation. Further, the same elements are denoted by the same reference numerals (or symbols) throughout the drawings, and redundant descriptions thereof are omitted as appropriate. In the third example embodiment, the quantum device 1 is mounted on a sample stage having a cooling function.

Figure 5:
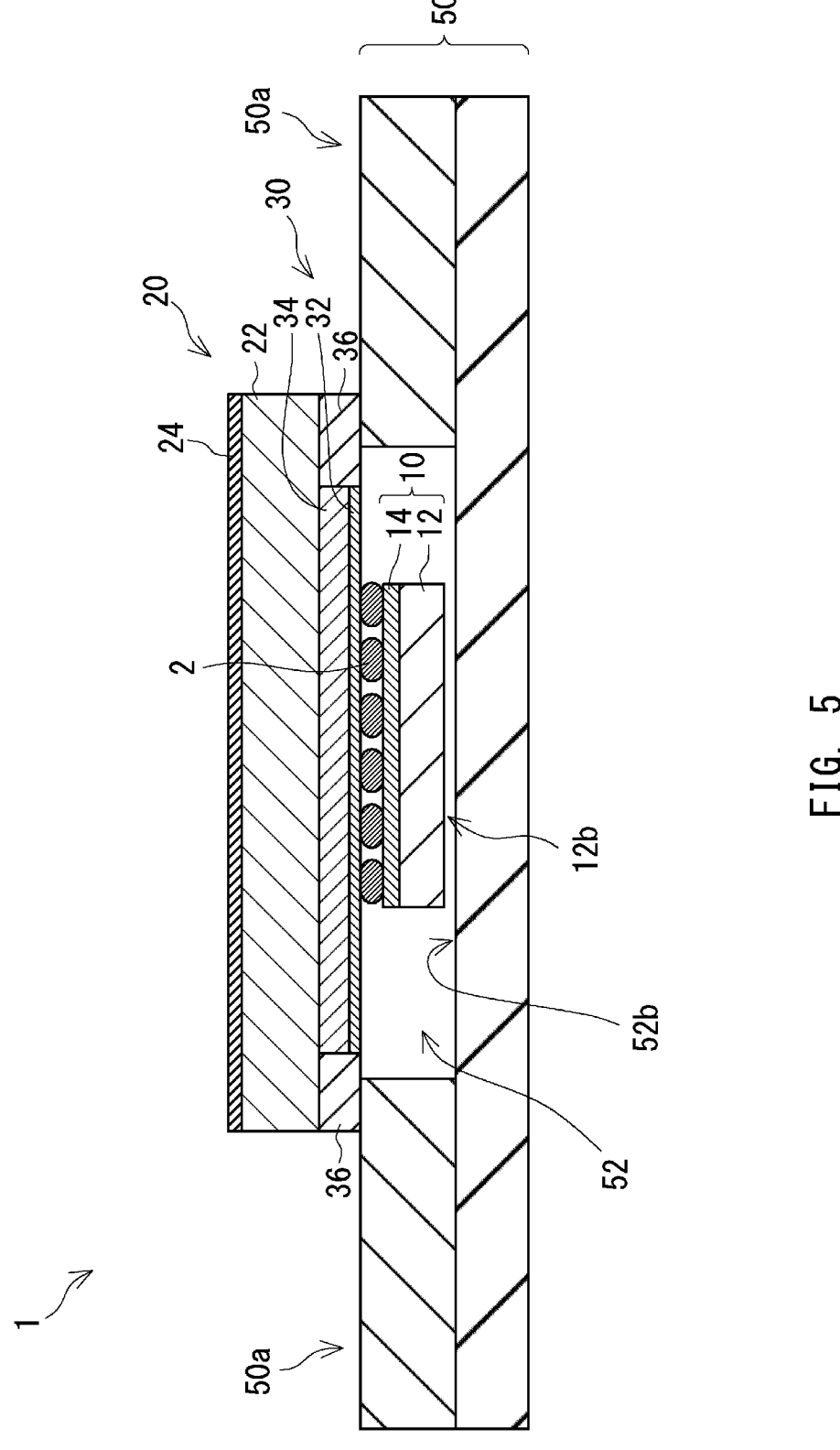
FIG. 5 shows a state in which a quantum device is mounted on a sample stage according to a third example embodiment.

FIG. 5 shows a state in which the quantum device 1 according to the third example embodiment is mounted on a sample stage 50. FIG. 5 is a cross-sectional view of the quantum device 1 and the sample stage 50. Note that, in FIG. 5, illustration of the through vias 26 is omitted (illustration of the through vias 26 are also omitted in the subsequent example embodiments).

Note that it may be considered that the quantum device 1 and the sample stage 50 may constitute a quantum device system. In other words, FIG. 5 shows a quantum device system including the quantum device 1 and the sample stage 50. The same applies to other example embodiments described later.

Note that FIG. 5 shows a state in which the quantum device 1 is mounted on the sample stage 50 according to the second example embodiment. Note that, in the example shown in FIG. 5, the area of the interposer wiring layer 30 outside the area thereof opposed to the quantum chip 10 (i.e., the area outside the quantum chip area Ar1) is not entirely composed of the non-superconducting material layer 36. As will be described later, the non-superconducting material layer 36 is provided in at least a part of an area of the interposer wiring layer 30 that is in contact with the sample stage 50.

The sample stage 50 is, for example, a cold stage that can be cooled to an extremely low temperature of about 10 [mK] by a refrigerator. The sample stage 50 preferably contains a metal such as copper (Cu), a copper alloy, or aluminum (Al). Further, in the case where the sample stage 50 contains aluminum, it may be insulated by carrying out an alumite treatment. In the quantum device 1 according to this example embodiment, for example, a superconducting phenomenon at an extremely low temperature of 9.2 [K] or lower is used when niobium (Nb) is contained as the superconducting material of the quantum chip 10, and a superconducting phenomenon at an extremely low temperature of 1.2 [K] or lower is used when aluminum (Al) is contained as the superconducting material of the quantum chip 10. Therefore, the sample stage 50 that can be cooled to such an extremely low temperature is used. Note that the sample stage 50 itself may function as a refrigerator (e.g., as a cold stage), or the sample stage 50 may be placed on a refrigerator (e.g., on a cold stage). The cold stage (the sample stage 50) may have a structure that transfers heat as it is connected to a part that is cooled by a refrigerator using a helium complex.

A recessed part 52 is formed in the upper surface 50a of the sample stage 50. The quantum device 1 is mounted on the sample stage 50 so that the quantum chip 10 is disposed inside the recessed part 52. Note that a surface 12b of the quantum-chip substrate 12 on the side opposite to the side thereof on which the interposer 20 is located, i.e., a surface 12b of the quantum-chip substrate 12 that is opposed to the bottom surface 52b of the recessed part 52 may be in contact with the bottom surface 52b of the recessed part 52 or may be separated from (i.e., apart from) the bottom surface 52b. When the surface 12b of the quantum-chip substrate 12 is in contact with the bottom surface 52b, at least a part of the surface 12b may be bonded to the bottom surface 52b by using an adhesive such as varnish or grease. Alternatively, at least a part of the surface 12b may be joined to the bottom surface 52b by a metal layer. Note that, when the surface 12b is separated from (i.e., apart from) the bottom surface 52b, the gap between these surfaces is in a vacuum state. Therefore, substantially no heat is directly discharged from the quantum chip 10 to the sample stage 50. Therefore, in such a case, heat is discharged (i.e., removed) through the interposer 20.

As described above, in the third example embodiment, the quantum chip 10 is cooled by inserting (i.e., placing) it in the recessed part 52 of the sample stage 50. In this way, it is possible to make full use of the surface of the interposer 20 opposite to the surface thereof on which the quantum chip 10 is located (i.e., the surface on the side on which the interposer wiring layer 24 is located) for terminals through which information is acquired from the quantum chip 10. Therefore, it is possible to increase the number of terminals through which information is acquired.

Note that although the quantum chip 10 is smaller than the recessed part 52 as viewed from above in FIG. 5, the interposer 20 is larger than the recessed part 52. Therefore, a part of the interposer 20 is in contact with the sample stage 50. Consequently, the quantum chip 10 is cooled by the sample stage 50 through the interposer 20. In other words, it is possible to cool the quantum chip 10 and the vicinity thereof by using the interposer 20 as a heat flow path. In this way, the cooling performance can be improved.

Further, in the third example embodiment, the non-superconducting material layer 36 of the interposer wiring layer 30 is in contact with the upper surface 50a of the sample stage 50 as shown in FIG. 5. Note that the interposer wiring layer 30 (the non-superconducting material layer 36) may be bonded to the upper surface 50a of the sample stage 50 by an adhesive, or may be joined to the upper surface 50a by a metal layer. Further, the non-superconducting material layer 36 and the upper surface 50a of the sample stage 50 may be electrically insulated from each other. In order to prevent electrical conduction with the sample stage 50, an insulating film may be formed in the part of the non-superconducting material layer 36 that is in contact with the upper surface 50a of the sample stage 50, or an insulating spacer is disposed in that part of the non-superconducting material layer 36. However, the layer between the non-superconducting material layer 36 and the upper surface 50a of the sample stage 50 preferably has excellent thermal conductivity.

Since the non-superconducting material layer 36 is in contact with the sample stage 50 as described above, the non-superconducting material layer 36 is directly cooled by the sample stage 50. Further, the non-superconducting material layer 36 is in contact with the non-superconducting material layer 34. Therefore, the non-superconducting material layer 36 is cooled by the sample stage 50, so that the non-superconducting material layer 34 is further cooled. In this way, it is possible to cool the quantum chip 10 and the vicinity thereof more effectively.

Fourth Example Embodiment

Next, a fourth example embodiment will be described. The following description and the drawings are partially omitted and simplified as appropriate for clarifying the explanation. Further, the same elements are denoted by the same reference numerals (or symbols) throughout the drawings, and redundant descriptions thereof are omitted as appropriate. In the fourth example embodiment, the shape of the sample stage 50 is different from that in the third example embodiment.

Figure 6:
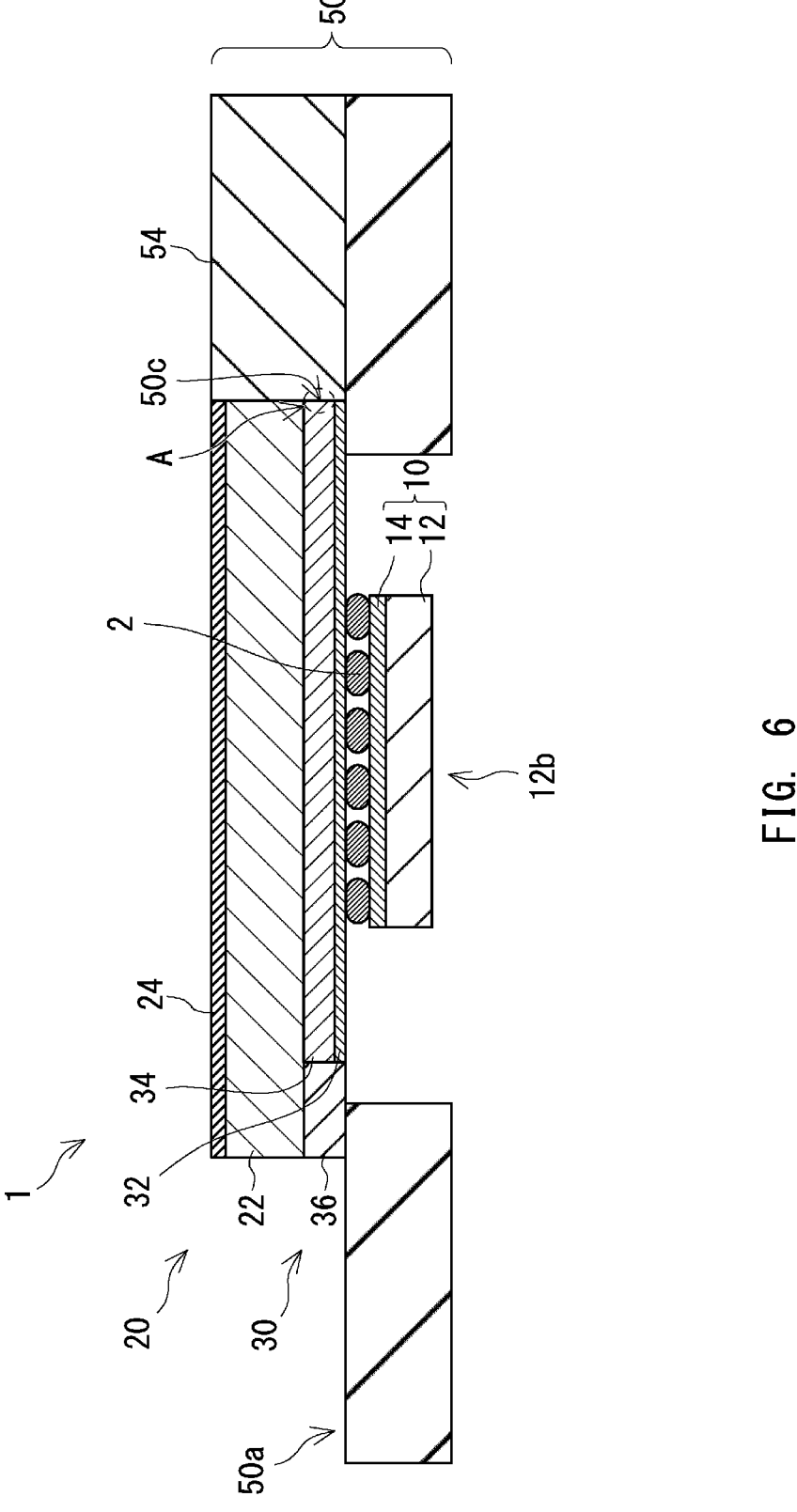
FIG. 6 shows a state in which a quantum device is mounted on a sample stage according to a fourth example embodiment.

FIG. 6 shows a state in which a quantum device 1 is mounted on a sample stage 50 according to the fourth example embodiment. FIG. 6 is a cross-sectional view of the quantum device 1 and the sample stage 50. In the fourth example embodiment, unlike the sample stage 50 according to the third example embodiment shown in FIG. 5, the sample stage 50 is not disposed in (i.e., does not extend to) the area around the surface 12b of the quantum chip substrate 12 as shown in FIG. 6. By adopting this structure, it is possible, when the sample stage 50 and the interposer 20 are deformed (contract or expand) due to a change in temperature (hereinafter also referred to as a temperature change), to prevent the sample stage 50 causing a stress concentration or exerting a strain onto the interposer 20, and thereby prevent the characteristics of the quantum device 1 from being changed due to the deformation or prevent the quantum device 1 from being broken due to the deformation, or prevent the cooling performance from deteriorating due to, instead of the occurrence of a stress or a strain, the formation of a gap. However, when it is possible to control the dimensions of the interposer 20 and the sample stage 50 after the cooling, the sample stage 50 may be disposed (i.e., may extend) on both sides of the quantum chip 10.

Further, in the fourth example embodiment, in the sample stage 50, a sample stage part 54 is disposed on the right side of the interposer 20 in FIG. 6. Therefore, the interposer 20 is in contact with the right side surface of the sample stage 50 in FIG. 6. Note that, in FIG. 6, no sample stage part 54 is provided on the left side of the interposer 20.

Further, in the fourth example embodiment, a non-superconducting material layer 36 is provided in a part of the interposer wiring layer 30 on the left side thereof that is in contact with the sample stage 50 in FIG. 6 as in the case of the second and third example embodiments. Therefore, in the interposer wiring layer 30, the non-superconducting material layer 36 is in contact with the upper surface 50a of the sample stage 50.

Further, no non-superconducting material layer 36 is provided on the right side of the interposer wiring layer 30 in FIG. 6. Meanwhile, since the sample stage part 54 is disposed on the right side of the interposer wiring layer 30 as described above, the side surface of the interposer wiring layer 30 is in contact with the sample stage 50. Note that, as indicated by an arrow A in FIG. 6, the side surface of the non-superconducting material layer 34 of the interposer wiring layer 30 is in contact with a surface 50c of the sample stage 50.

Since the non-superconducting material layer 34 is in contact with the sample stage 50 as described above, the non-superconducting material layer 34 is directly cooled by the sample stage 50. In this way, even when no non-superconducting material layer 36 is provided, the quantum chip 10 and the vicinity thereof can be effectively cooled. In other words, in the interposer wiring layer 30, even when the surface of the interposer wiring layer 30 on the side thereof on which the quantum chip 10 is located is not composed of the non-superconducting material layer, the quantum chip 10 and the vicinity thereof can be cooled. Note that if the sample stage part 54 is provided on the left side of the interposer 20, it may restrain the interposer 20 when the interposer 20 is deformed (contracts or expands) due to the temperature change. Therefore, as shown in FIG. 6, no sample stage part 54 is preferably provided on one of the sides of the interposer 20. Accordingly, the non-superconducting material layer 36 is preferably provided on the side of the interposer wiring layer 30 on which no sample stage part 54 is provided. In this way, the cooling effect can be improved as in the case of the third example embodiment.

Fifth Example Embodiment

Next, a fifth example embodiment will be described. The following description and the drawings are partially omitted and simplified as appropriate for clarifying the explanation. Further, the same elements are denoted by the same reference numerals (or symbols) throughout the drawings, and redundant descriptions thereof are omitted as appropriate. In the fifth example embodiment, the part of the interposer 20 that is cooled is different from those in the third and fourth example embodiments.

Figure 7:
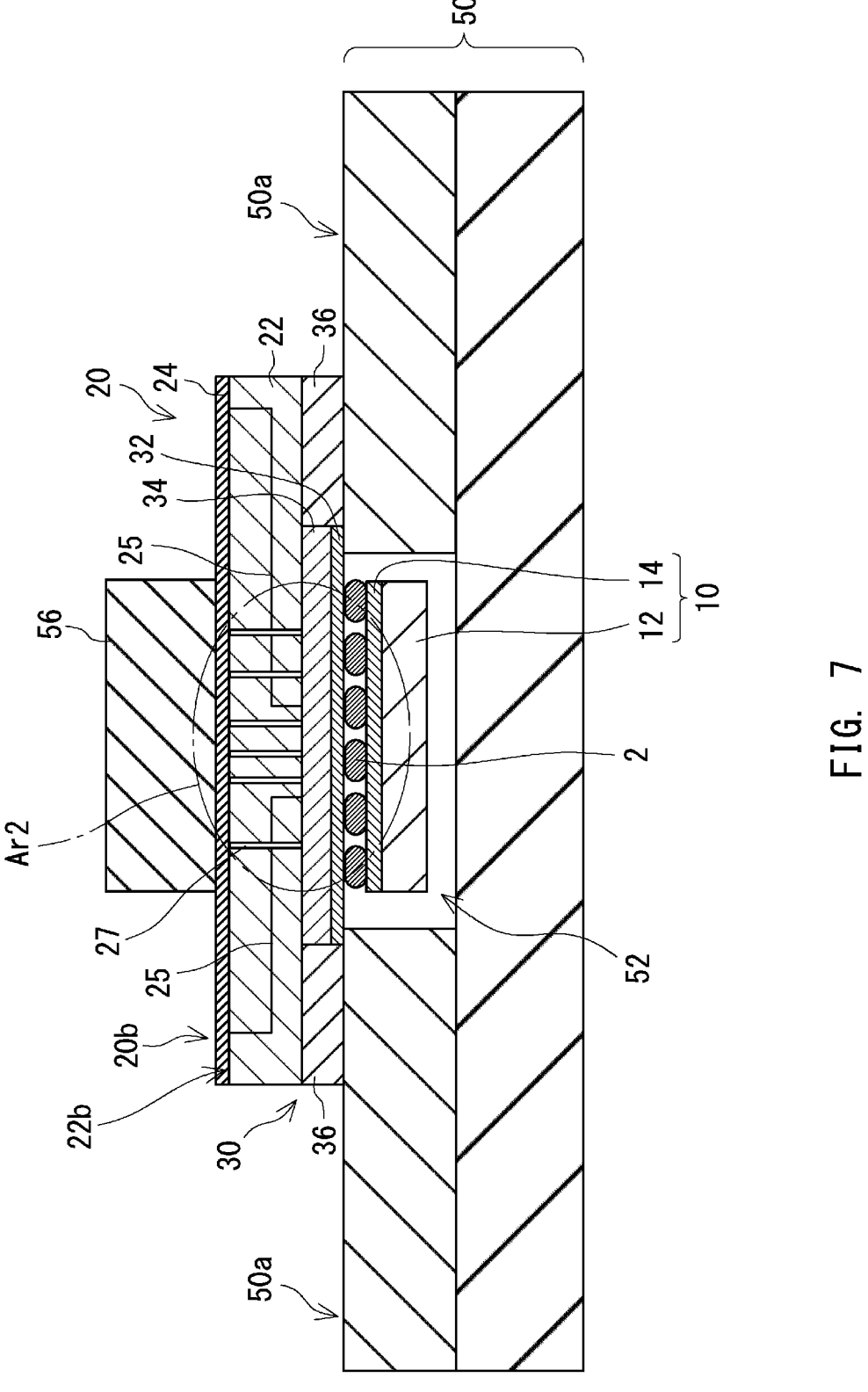
FIG. 7 shows a state in which a quantum device is mounted on a sample stage according to a fifth example embodiment.

FIG. 7 shows a state in which a quantum device 1 is mounted on a sample stage 50 according to the fifth example embodiment. FIG. 7 is a cross-sectional view of the quantum device 1 and the sample stage 50. Similarly to the third example embodiment, the quantum device 1 is mounted on the sample stage 50 so that the quantum chip 10 is disposed inside the recessed part 52 as shown in FIG. 7. Further, similarly to the third example embodiment, FIG. 7 shows a state in which the quantum device 1 is mounted on the sample stage 50 according to the second example embodiment. Note that, in the example shown in FIG. 7, the area of the interposer wiring layer 30 outside the area thereof opposed to the quantum chip 10 is not entirely composed of the non-superconducting material layer 36. Further, not whole parts of the interposer wiring layer 30 that are in contact with the sample stage 50 are provided with the non-superconducting material layer 36. In the example shown in FIG. 7, the non-superconducting material layer 36 is provided in at least a part of the interposer wiring layer 30 that is in contact with the sample stage 50.

Further, a cooling member 56 is disposed on the surface 20b of the interposer 20 on the side opposite to the side thereof on which the quantum chip 10 is located. The surface 20b may be in contact with the cooling member 56. The cooling member 56 includes a cooling function. For example, the cooling member 56 may have a cooling function that is obtained as the cooling member 56 thermally comes into contact with the sample stage 50. By the above-described configuration, it is possible to cool the surface 20b of the interposer 20 by the cooling member 56, and thereby to improve the cooling performance. Further, in order to effectively cool the quantum chip 10 and the vicinity thereof through thermal vias 27 (which will be described later), the cooling member 56 is preferably disposed at a place on the surface 20b that corresponds to the place of the quantum chip 10. That is, in FIG. 7, the cooling member 56 is preferably disposed so that its position on the surface 20b corresponds to the area in which the quantum chip 10 is located.

Further, thermal vias 27 (vias) are formed in the interposer substrate 22. The thermal vias 27 penetrate (i.e., extend through) the interposer substrate 22. In this way, the interposer wiring layers 24 and 30 are connected to each other through the thermal vias 27. Specifically, the thermal vias 27 can transfer heat between the interposer wiring layers 30 and 24. Further, in order to effectively cool the quantum chip 10 and the vicinity thereof through the thermal vias 27, the thermal vias 27 are preferably disposed at places corresponding to the quantum chip area Ar1 (see FIG. 4).

The thermal vias 27 are formed of a material having high thermal conductivity. Therefore, the thermal vias 27 may be formed of the above-described non-superconducting material so that they maintain the thermal conductivity even at an extremely low temperature. Note that the through vias 26 may be used as the thermal vias 27. In such a case, the through vias 26 may be formed of a non-superconducting material. In particular, when the through vias 26 are connected to the ground electrode, the through vias 26 may be used as the thermal vias 27. Further, the thermal vias 27 may be formed of ceramic having high thermal conductivity such as aluminum nitride.

Figure 8:
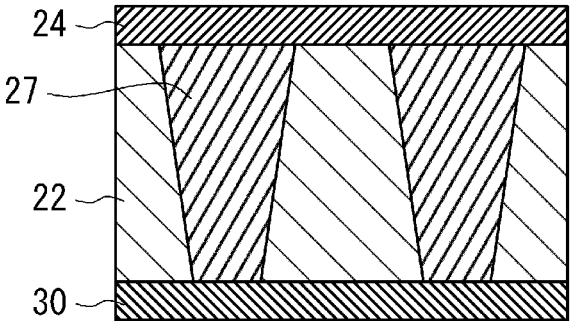
FIG. 8 shows an example of a shape of thermal vias according to the fifth example embodiment.
Figure 9:
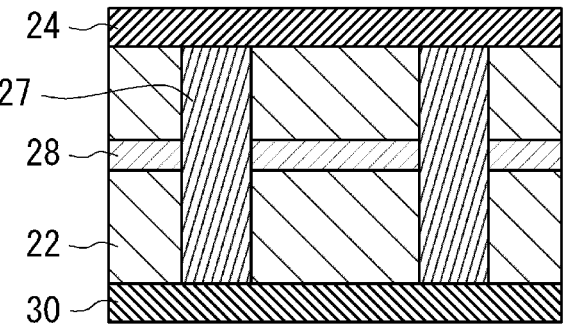
FIG. 9 shows an example of a shape of thermal vias according to the fifth example embodiment.

FIGS. 8 and 9 show examples of the shape of thermal vias 27 according to the fifth example embodiment. As shown in FIG. 8 as an example, the thermal vias 27 may include a tapered part (or a tapered via) in which the diameter on the interposer wiring layer 24 side is larger than that on the interposer wiring layer 30 side. That is, the thermal vias 27 may include a part (or a thermal via) having a roughly truncated cone shape of which the diameter of the cross section increases toward the interposer wiring layer 24 side. Because of the temperature change to an extremely low temperature, in the thermal vias 27, a difference between the contraction of the interposer wiring layer 30 and that of the interposer wiring layer 24 occurs. However, it is possible to absorb the contraction difference and thereby to prevent a stress and a strain from occurring in the thermal vias 27 by forming a tapered part (or a tapered via). Further, by forming a tapered part (or a tapered via) in which the diameter on the interposer wiring layer 24 side is larger than that on the interposer wiring layer 30 side, it is possible to increase the area of the thermal via that is in contact with the cooling member 56 and thereby to effectively transfer heat.

Further, as shown in FIG. 9 as an example, the interposer 20 may include a common connection member 28 that connects a plurality of thermal vias 27 to each other. For example, a plurality of thermal vias 27 may be connected to each other by a plate-like connection member 28. The connection member 28 preferably contains a material having high thermal conductivity, and may contain a material similar to that contained in the thermal vias 27. The plurality of thermal vias 27 connected by the connection member 28 can increase the heat capacity and thereby reduce the temperature change. Further, it is possible to provide a ground potential to the quantum chip 10 or the interposer 20 through the thermal vias 27 by applying the ground potential to the connection member 28. Note that, in such a case, the thermal vias 27 and the connection member 28 preferably contain an electrically conductive material having high thermal conductivity.

Further, in the interposer 20, an area in which wiring lines or signal lines connected to the quantum circuit formed in the quantum chip 10 (i.e., to the quantum chip area Ar1) are disposed generates a larger amount of heat than the other areas do. Therefore, the density of thermal vias 27 in the heat generating area Ar2, i.e., the area in which heat is generated as described above is preferably made higher than the density thereof in the other areas. For example, when the quantum chip 10 is mounted at the center of the interposer 20 as viewed from above the interposer substrate 22, the density of thermal vias 27 in the central area of the interposer 20 is made higher than the density thereof in the peripheral area thereof. Further, in the interposer 20, the density of thermal vias 27 in the vicinity of the through vias 26, through which signals from the quantum circuit are transmitted, is preferably also made higher than the density thereof in the other areas. In this way, the cooling effect in the heat generating area Ar2 (the quantum chip area Ar1) can be improved.

Further, when the cooling member 56 is disposed at a place on the surface 20b that is directly above the quantum chip 10, a signal circuit 25 for exchanging signals with the quantum chip 10 may be provided in the interposer substrate 22. One end of the signal circuit 25 is disposed in a place in which the one end is opposed to the quantum chip 10, and the other end thereof is located in an area on the surface 22b outside the cooling member 56. As an example, the signal circuit 25 is formed by using wiring lines and vias formed inside the interposer substrate 22.

Further, when the heat generating area Ar2 (the quantum chip area Ar1) can be sufficiently cooled by the cooling member 56, the interposer wiring layer 30 does not have to be in contact with the sample stage 50. However, it is possible to more effectively perform the cooling by bringing the interposer wiring layer 30 into contact with the sample stage 50.

Further, in the fifth example embodiment, the interposer wiring layers 30 and 24, and the thermal vias 27 are formed of a non-superconducting material(s). Therefore, it is possible to check the electrical conduction in a temperature range before a superconducting state (e.g., at about −200 degrees) is obtained. Since the resistance value (the electrical resistance) of a superconducting material is high before it becomes a superconducting state, it is difficult to detect a small change in the resistance value in this state (i.e., the state before the superconducting state). On the other hand, the resistance value of a non-superconducting material such as copper (Cu) is lower than that of a superconducting material in this temperature range before the superconducting state. Therefore, it is possible to determine whether or not the electrical conduction has deteriorated (such as the resistance has increased or disconnection has occurred) due to the deformation, such as contraction, of components (e.g., components constituting the quantum device 1) during the cooling. In this way, it is possible, when the electrical conduction of the non-superconducting material has deteriorated, to infer that there is a possibility that a problem also occurs in the electrical conduction of the superconducting material.

Sixth Example Embodiment

Next, a sixth example embodiment will be described. The following description and the drawings are partially omitted and simplified as appropriate for clarifying the explanation. Further, the same elements are denoted by the same reference numerals (or symbols) throughout the drawings, and redundant descriptions thereof are omitted as appropriate. In the sixth example embodiment, pressing members are provided on a predetermined surface of the sample stage 50.

Figure 10:
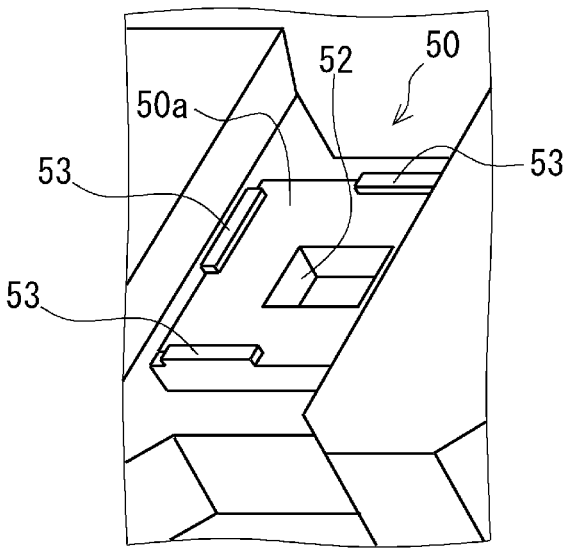
FIG. 10 shows an example of pressing members according to a sixth example embodiment.
Figure 11:
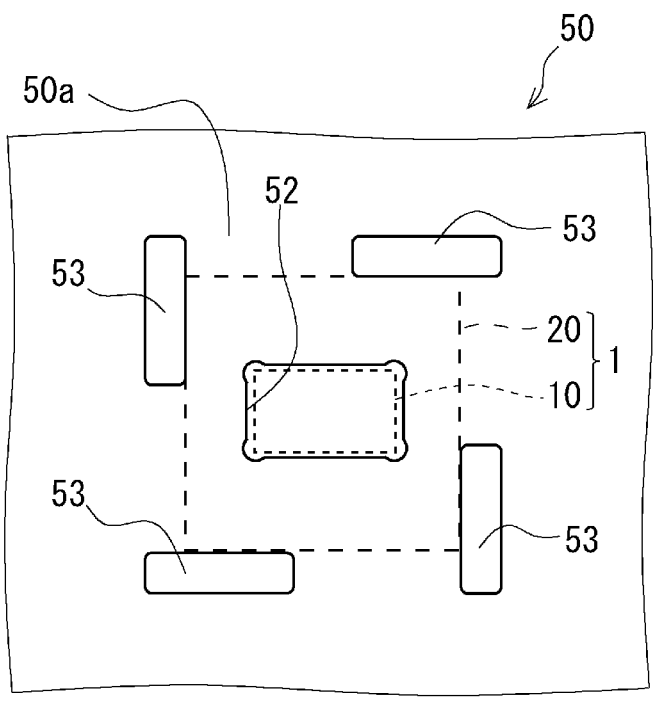
FIG. 11 shows an example of pressing members according to the sixth example embodiment.

FIGS. 10 and 11 show examples of pressing members 53 according to the sixth example embodiment. FIG. 10 is a perspective view showing an example of a recessed part 52 and pressing members 53 of the sample stage 50. FIG. 11 is a plan view showing the example of the recessed part 52 and the pressing members 53 of the sample stage 50. Further, FIG. 11 also shows a plan view of the quantum device 1. As shown in FIGS. 10 and 11, the recessed part 52 of the sample stage 50 is formed on a predetermined surface of the sample stage 50, e.g., on the upper surface 50a of the sample stage 50. Further, a plurality of pressing members 53 are provided on the upper surface 50a around the recessed part 52. For example, four pressing members 53 are provided on the upper surface 50a.

At least a part of the side surface of the interposer 20 is in contact with (at least one of) the pressing members 53 provided on the upper surface 50a. For example, in the case where the interposer 20 has a rectangular shape as viewed from above, flat-surface parts of the plurality of pressing members 53 press parts of the side surface of the interposer 20 near the respective corners thereof. By the above-described configuration, the plurality of pressing members 53 can press, by the flat-surface parts thereof, diagonal parts of the side surface of the interposer 20 in a discontinuous manner (i.e., a distributed manner). Therefore, this feature enables the interposer 20 or the pressing members 53 to linearly move in a sliding manner when the interposer 20 or the pressing members 53 contract at a low temperature, making it possible to make the contraction uniform.

Modified Example

Note that the present disclosure is not limited to the above-described example embodiments and various modifications can be made within the scope and spirit of the present disclosure. For example, a quantum device in which a plurality of quantum chips 10 are connected to one interposer 20 is also included in the scope of the technical idea according to the example embodiments. Further, for example, although the quantum chip 10 is disposed below the interposer 20 in each of the quantum devices 1 shown in FIG. 1 and FIGS. 3 to 7, the configuration of the quantum device 1 is not limited to this configuration. Similarly to the comparative example shown in FIG. 2, the quantum chip 10 may be disposed above the interposer 20. Further, similarly to the comparative example shown in FIG. 2, the quantum device 1 may be mounted on the sample stage 50 in this arrangement. However, by disposing the quantum device 1 on the sample stage 50 as shown in FIGS. 4 to 7 and the like, it is possible to directly cool the interposer wiring layer 30 of the interposer 20 and thereby to improve the cooling effect.

Further, in FIGS. 5 to 7, the quantum device 1 according to the second example embodiment is mounted on the sample stage 50. However, the quantum device 1 according to the first example embodiment may be mounted on the sample stage 50. However, by disposing the quantum device 1 according to the second example embodiment on the sample stage 50, it is possible to easily bring the non-superconducting material layer having excellent thermal conductivity into contact with the sample stage 50. Therefore, the cooling effect can be improved.

The first to sixth embodiments can be combined as desirable by one of ordinary skill in the art.

While the disclosure has been particularly shown and described with reference to embodiments thereof, the disclosure is not limited to these embodiments. It will be understood by those of ordinary skill in the art that various changes in form and details may be made therein without departing from the spirit and scope of the present disclosure as defined by the claims.

What is claimed is:

1. A quantum device system comprising:

a quantum device; and a sample stage having a cooling function, wherein the quantum device comprises:

a quantum chip; and an interposer on which the quantum chip is mounted, the interposer comprises:

a substrate; and a wiring layer disposed on a surface of the substrate on a side thereof on which the quantum chip is located, the wiring layer comprises, in at least a part thereof, a first metal layer formed of a superconducting material and a second metal layer formed of a non-superconducting material, the quantum device is mounted on the sample stage with the sample stage being in contact with a surface of at least the second metal layer, disposed on a surface of the wiring layer, on a side thereof on which the quantum chip is located.

2. The quantum device system according to claim 1, wherein the quantum chip comprises a superconducting wiring layer, and bumps connect only the first metal layer of the interposer and the superconducting wiring layer of the quantum chip.

3. The quantum device system according to claim 1, wherein the first metal layer is a metal layer closest to the quantum chip at least in a first area.

4. The quantum device system according to claim 1, wherein a thickness of the second metal layer in the wiring layer is larger than that of the first metal layer in the wiring layer.

5. The quantum device system according to claim 2, wherein the bumps are formed of a second superconducting material.

6. The quantum device system according to claim 1, wherein the sample stage has a recessed part; and the quantum device is mounted on the sample stage so that the quantum chip is disposed inside the recessed part.

\*   \*   \*   \*   \*